United States Patent [19]
Okajima et al.

[11] Patent Number: 5,241,225
[45] Date of Patent: Aug. 31, 1993

[54] LEVEL CONVERSION CIRCUIT HAVING IMPROVED CONTROL AND SPEED OF SWITCHING FROM HIGH TO LOW LEVEL CONVERTER OUTPUTS

[75] Inventors: Yoshinori Okajima; Kazuhide Kurosaki, both of Kawasaki, Japan

[73] Assignee: Fujitsu Limited, Kawasaki, Japan

[21] Appl. No.: 812,918

[22] Filed: Dec. 26, 1991

[30] Foreign Application Priority Data

Dec. 26, 1990 [JP] Japan .................. 2-406445

[51] Int. Cl.[5] .................. H03K 19/094; H03K 17/16; H03K 17/28
[52] U.S. Cl. .................. 307/475; 307/443; 307/451; 307/594
[58] Field of Search .................. 307/443, 451, 475, 594

[56] References Cited

U.S. PATENT DOCUMENTS

| | | | |
|---|---|---|---|
| 4,518,873 | 5/1985 | Suzuki et al. | 307/451 |
| 4,760,279 | 7/1988 | Saito et al. | 307/443 |
| 4,845,381 | 4/1989 | Cuevas | 307/475 |
| 4,978,870 | 12/1990 | Chen et al. | 307/475 |
| 5,023,480 | 6/1991 | Gieseke et al. | 307/451 |
| 5,075,581 | 12/1991 | Kamata | 307/451 |

FOREIGN PATENT DOCUMENTS

| | | |
|---|---|---|
| 2909388 | 9/1979 | Denmark. |
| 3729925 | 3/1989 | Denmark. |
| 232969 | 8/1987 | European Pat. Off.. |
| 3-55914 | 3/1991 | Japan .................. 307/451 |

OTHER PUBLICATIONS

IEEE ICCD'89 Conference Proceedings, Oct. 1989, Cambridge, U.S., pp. 314-317; G. Boudon et al., "Internal ECL-BICMOS translator circuits in half micron technology".

Primary Examiner—Edward P. Westin
Assistant Examiner—Benjamin D. Driscoll
Attorney, Agent, or Firm—Staas & Halsey

[57] ABSTRACT

A level conversion circuit includes a first pMOS transistor having a source connected to a first power supply line, a gate receiving a first input signal, and a drain, and a second pMOS transistor having a source connected to the first power supply line, a gate receiving a second input signal, and a drain. A first nMOS transistor has a drain connected to a first output terminal and the drain of the first pMOS transistor, a gate, and a source. A first output signal is output via the first output terminal. A second nMOS transistor has a drain connected to a second output terminal, the drain of the second pMOS transistor and the gate of the first nMOS transistor, a gate connected to the drain of the first nMOS transistor, and a source. A second output signal is output via the second output terminal. A control part prevents a current from passing through the first pMOS transistor and the first nMOS transistor when both the first pMOS transistor and the first nMOS transistor are ON, and prevents a current from passing through the second pMOS transistor and the second nMOS transistor when both the second pMOS transistor and the second nMOS transistor are ON.

17 Claims, 14 Drawing Sheets

FIG. I PRIOR ART
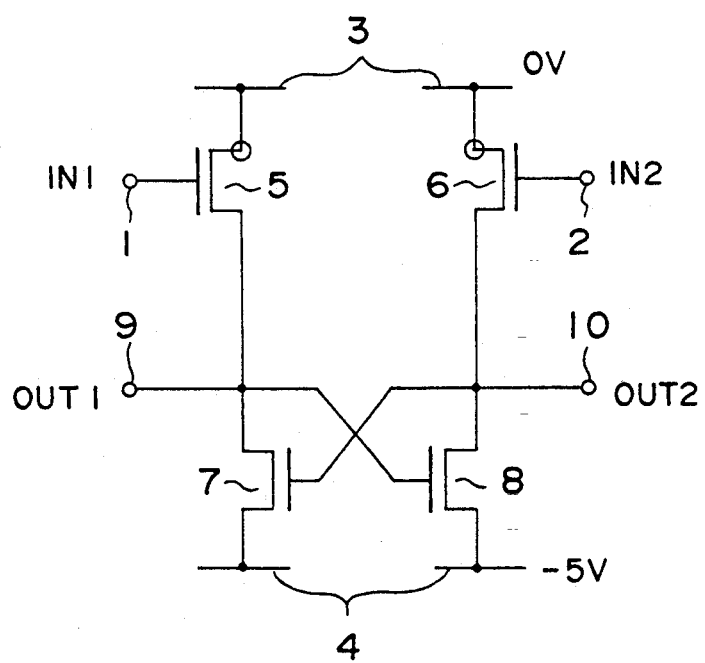

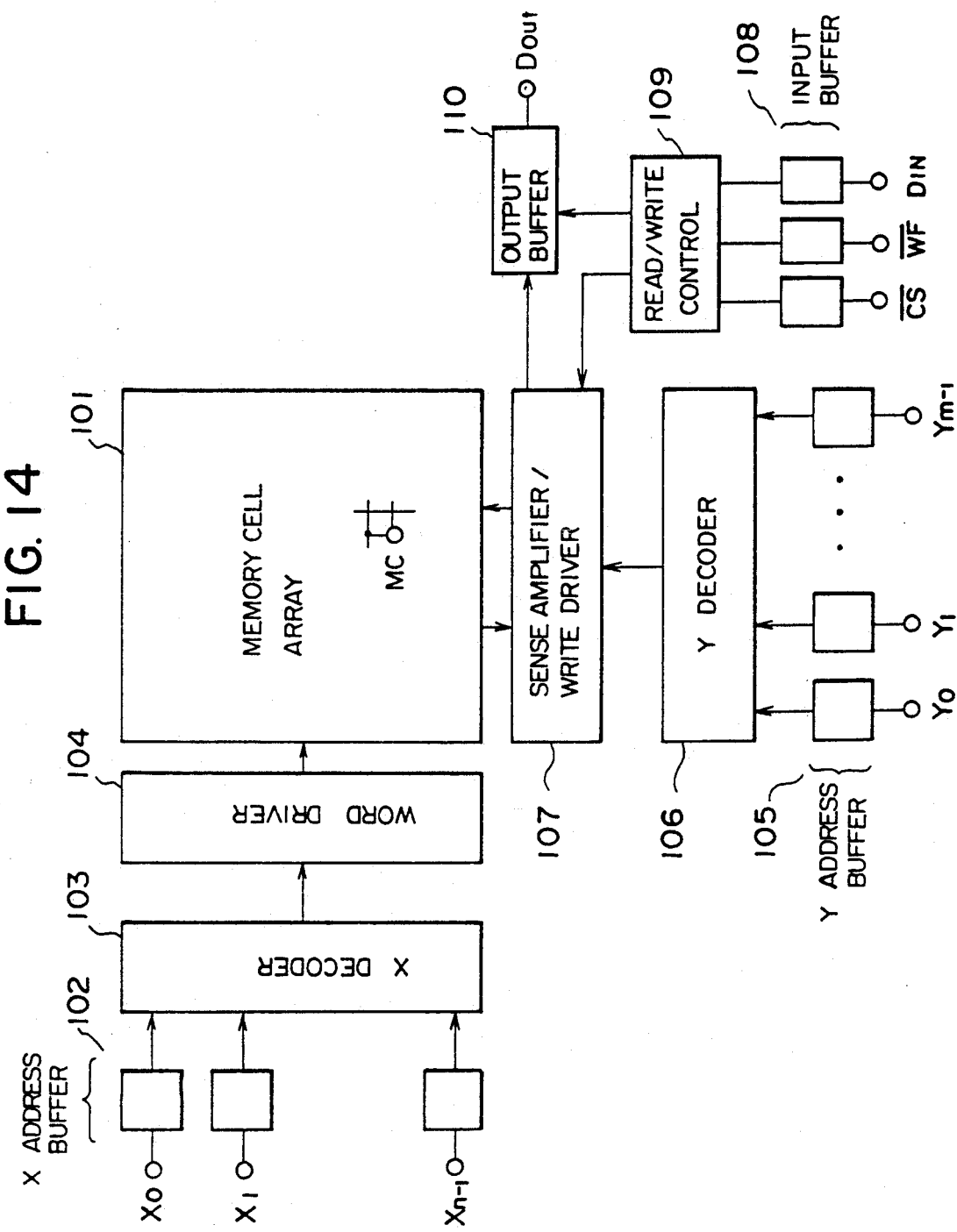

LEVEL CONVERSION CIRCUIT HAVING IMPROVED CONTROL AND SPEED OF SWITCHING FROM HIGH TO LOW LEVEL CONVERTER OUTPUTS

BACKGROUND OF THE INVENTION (1) Field of the Invention

The present invention generally relates to level conversion circuits which amplify input logic signals having small amplitudes (ECL levels) and generate output logic signals having large amplitudes (CMOS or TTL levels).

(2) Description of the Prior Art

FIG. 1 shows an ECL-CMOS level conversion circuit, which receives complementary ECL input signals IN1 and IN2 and outputs complementary CMOS output signals OUT1 and OUT2. Each of the ECL input signals IN1 and IN2 has a high (H) level of −0.8 V and a low (L) level of −1.8 V. Each of the CMOS output signals OUT1 and OUT2 has a high (H) level of 0 V and a low (L) level of −5 V.

The ECL-CMOS level conversion circuit shown in FIG. 1 is composed of two input terminals 1 and 2, two output terminals 9 and 10, two pMOS (p-channel Metal Oxide Semiconductor) transistors 5 and 6, and two nMOS (n-channel Metal Oxide Semiconductor) transistors 7 and 8. The sources of the pMOS transistors 5 and 6 are connected to a power supply line 3 set equal to 0 V, and the sources of the nMOS transistors 7 and 8 are connected to a power supply line 4 set equal to −5 V. The input signals IN1 and IN2 are applied to the gates of the pMOS transistors 5 and 6 via the input terminals 1 and 2, respectively, and output signals OUT1 and OUT2 are output via the output terminals 9 and 10 connected to the drains of the nMOS transistors 7 and 8, respectively.

As shown in FIG. 2A, the pMOS transistors 5 and 6 are OFF and ON, respectively, and the nMOS transistors 7 and 8 are ON and OFF, respectively, when the input signals IN1 and IN2 are maintained at −0.8 V and −1.8 V, respectively. In this case, the output signals OUT1 and OUT2 are maintained at −5 V and 0 V, respectively.

As shown in FIG. 2B, when the input signals IN1 and IN2 switch to −1.8 V and −0.8 V, respectively, the pMOS transistors 5 and 6 turn ON and OFF, respectively, and the nMOS transistors 7 and 8 turn OFF and ON, respectively. Hence, the output signals OUT1 and OUT2 switch to 0 V and −5 V, respectively. In this manner, the level conversion operation is executed.

FIG. 3 is a waveform diagram showing the operation of the level conversion circuit shown in FIG. 1 observed when a threshold voltage of each of the pMOS transistors 5 and 6 is −1.3 V and a threshold voltage of each of the nMOS transistors 7 and 8 is −4.0 V. When the output signals OUT1 and OUT2 switch to H and L levels from L and H levels, respectively, a period T1 is obtained during which both the pMOS transistor 5 and the nMOS transistor 7 are ON. During the period T1, through current passes through the pMOS transistor 5 and the nMOS transistor 7, and hence current which drives a load is reduced. As a result, it takes a long time for the output signal OUT1 to switch to H level from L level, and the level conversion circuit does not operate at a high speed.

Further, as shown in FIG. 3, a period T2 occurs during which both the pMOS transistor 6 and the nMOS transistor 8 are ON when the output signals OUT1 and OUT2 switch to the L and H levels from the H and L levels, respectively. During the period T2, through current passes through the pMOS transistor 6 and the nMOS transistor 8, and hence current which drives a load decreases. As a result, it takes a long time for the output signal OUT2 to switch to H level from L level.

Japanese Laid-Open Patent Application No. 3-55914 discloses a level conversion circuit intended to overcome the above disadvantages. A first nMOS transistor is connected between the nMOS transistor 7 shown in FIG. 1 and the power supply line 4, and a second nMOS transistor is connected between the nMOS transistor 8 and the power supply line 4. The gate of the first nMOS transistor receives the input signal IN1, and the gate of the second nMOS transistor receives the input signal IN2.

As has been described previously, the input signals IN1 and IN2 are ECL-level signals, and the L level thereof is approximately −1.8 V. Normally, an nMOS transistor has a threshold voltage (gate-source voltage) equal to 3.3 V. When the input signal IN1 switches to L level from H level, L level of −1.8 V is applied to the gate of the first nMOS transistor. Hence, the first nMOS transistor does not completely turn OFF, and a small amount of current passes through the pMOS transistor 5, the nMOS transistor 7 and the first nMOS transistor. As a result, the level conversion circuit shown in the above-mentioned Japanese application does not entirely eliminate the disadvantages of the level conversion circuit shown in FIG. 1.

SUMMARY OF THE INVENTION

It is a general object of the present invention to provide an improved level conversion circuit in which the above disadvantages are eliminated.

A more specific object of the present invention to provide a level conversion circuit in which the switching of the output signals is performed at a higher speed than in the conventional circuit.

The above objects of the present invention are achieved by a level conversion circuit comprising:

a first p-channel MOS (pMOS) transistor having a source connected to a first power supply line, a gate receiving a first input signal, and a drain;

a second pMOS transistor having a source connected to the first power supply line, a gate receiving a second input terminal, and a drain;

a first n-channel MOS (nMOS) transistor having a drain connected to a first output terminal and the drain of the first pMOS transistor, a gate, and a source, a first output signal being output via the first output signal;

a second nMOS transistor having a drain connected to a second output terminal, the drain of the second pMOS transistor and the gate of the first nMOS transistor, a gate connected to the drain of the first nMOS transistor, and a source, a second output signal being output via the second output terminal; and switch means for preventing a current from passing through the first pMOS transistor and the first nMOS transistor when both the first pMOS transistor and the first nMOS transistor are ON and for preventing a current from passing through the second pMOS transistor and the second nMOS transistor when both the second pMOS transistor and the second nMOS transistor are ON.

BRIEF DESCRIPTION OF THE DRAWINGS

Other objects, features and advantages of the present invention will become more apparent from the following detailed description when read in conjunction with the accompanying drawings, in which:

FIG. 1 is a circuit diagram of a conventional level conversion circuit;

FIG. 14 is a block diagram of an SRAM to which the present invention is applied;

DESCRIPTION OF THE PREFERRED EMBODIMENTS

Figure 2A:
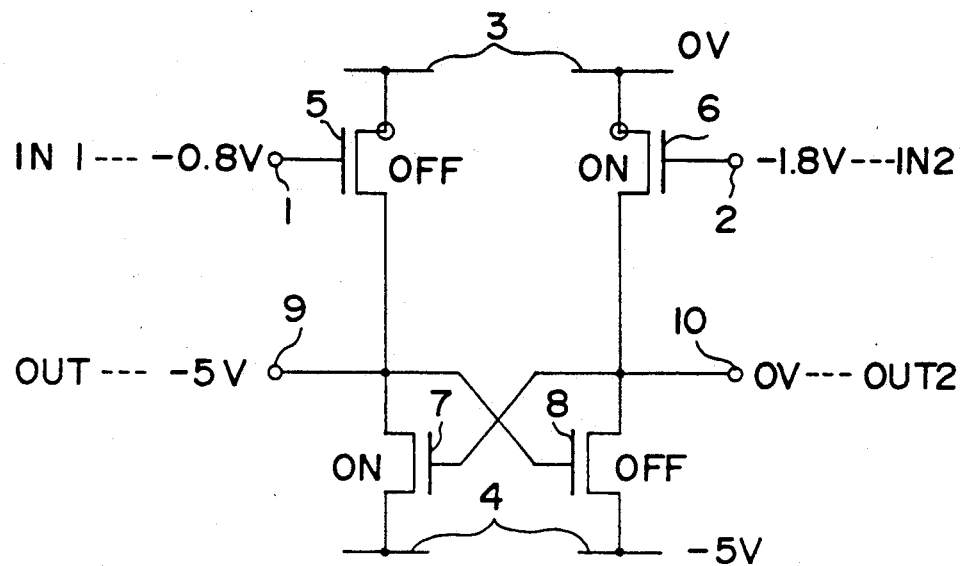
FIGS. 2A and 2B are circuit diagrams of the level conversion circuit shown in FIG. 1.
Figure 2B:
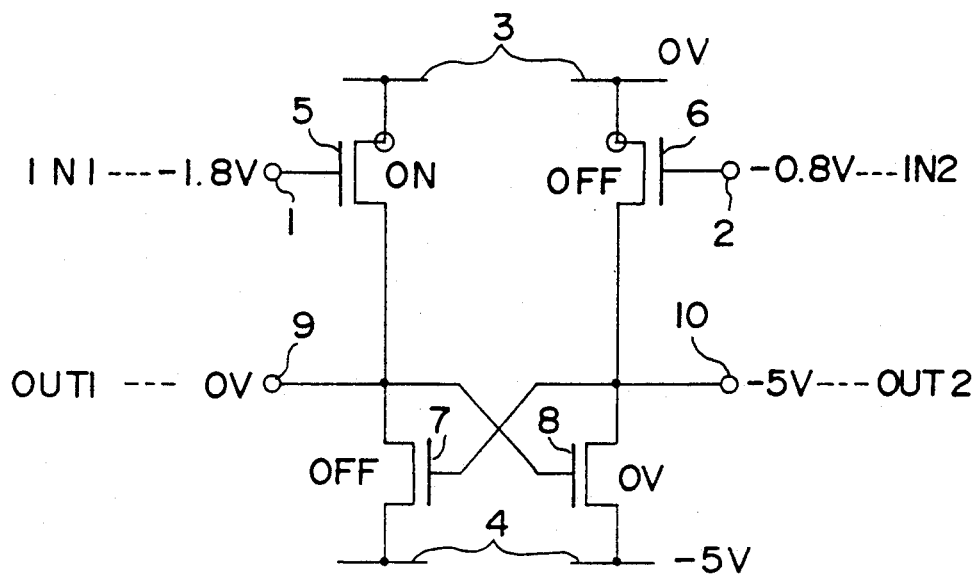
Figure 3:
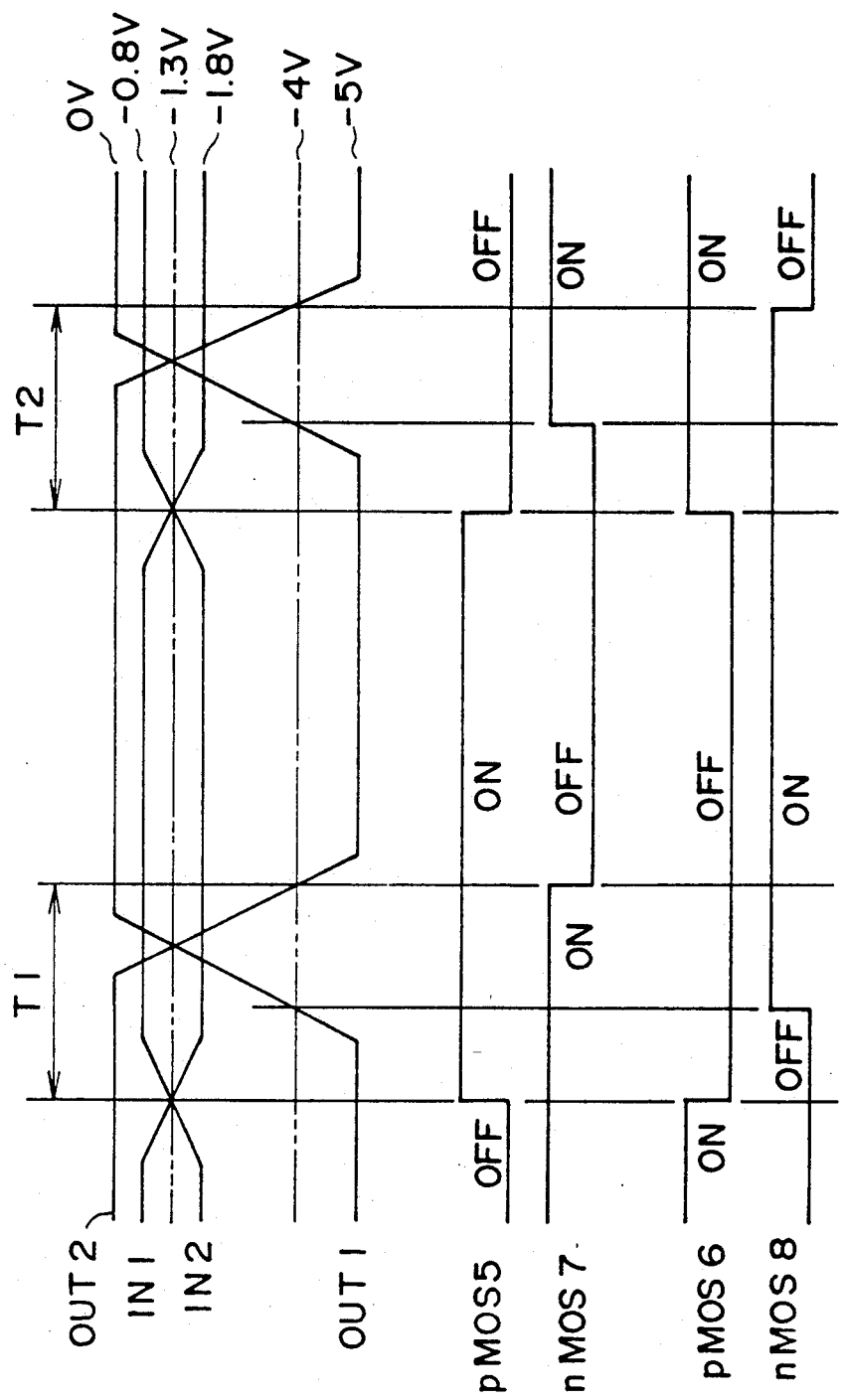
FIG. 3 is a waveform diagram showing the operation of the level conversion circuit shown in FIG. 1.
Figure 4:
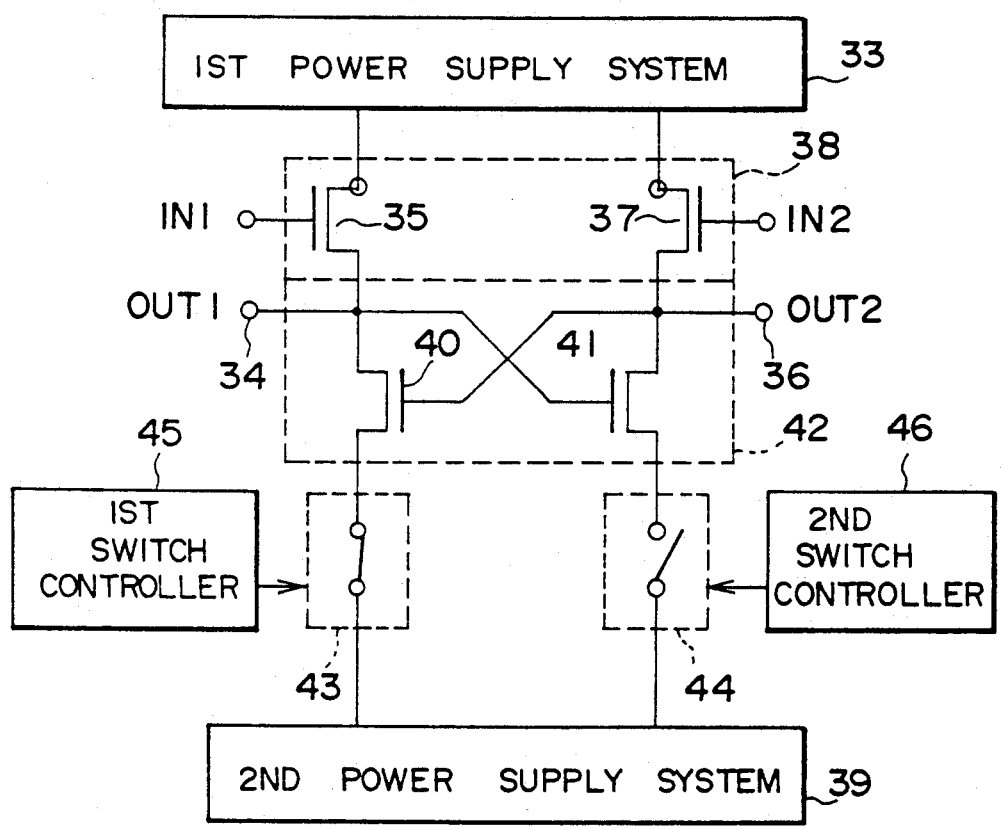
FIG. 4 is a schematic block diagram of the present invention.

FIG. 4 is a schematic block diagram of the present invention. The circuit shown in FIG. 4 includes a driving circuit (level converter) 38, a first switch element 43, a second switch element 44, a first switch controller 45, and a second switch controller 46. A control circuit is composed of the first and second switch elements 43 and 44, and the first and second switch controllers 45 and 46. The driving circuit 38 is composed of two pMOS transistors 35 and 37, and two nMOS transistors 40 and 41. That is, the driving circuit 38 has the same structure as the circuit shown in FIG. 1. The sources of the pMOS transistors 35 and 37 are connected to a first power supply system (line) 33. Complementary input signals IN1 and IN2 are applied to the gates of the pMOS transistors 35 and 38. An output terminal 34, via which an output signal OUT1 is obtained, is connected to the drain of the nMOS transistor 40, and an output terminal 36, via which an output signal OUT2 is obtained, is connected to the drain of the nMOS transistor 41. The gates of the nMOS transistors 40 and 41 are connected to the drains of the nMOS transistors 41 and 40, respectively. The first switch element 43 is interposed between the source of the nMOS transistor 40 and a second power supply system (line) 39. The second switch element 44 is interposed between the source of the nMOS transistor 41 and the second power supply system 39. Alternatively, it is possible to provide the first switch element 43 between the output terminal 34 and the drain of the nMOS transistor 40 and provide the second switch element 44 between the output terminal 36 and the drain of the nMOS transistor 41.

The first switch controller 45 controls the first switch element 43 to be ON when the output signal OUT1 switches to L level from H level, and to be OFF when the output signal OUT1 switches to H level from L level. The second switch controller 46 controls the second switch element 44 so that it is ON when the output signal OUT2 switches to L level from H level, and to be OFF when the output signal OUT2 switches to H level from L level.

When the output signal OUT1 switches to H level from L level, that is, when both the pMOS transistor 35 and the nMOS transistor 40 are ON, the first switch element 43 is controlled to be OFF. Hence, it is possible to prevent a through current from passing through the pMOS transistor 35 and the nMOS transistor 40. The first switch element 43 does not affect the circuit operation at all when the output signal OUT1 switches to L level from H level, because the first switch element 43 is controlled to be ON.

When the output signal OUT2 switches to H level from L level, that is, when both the pMOS transistor 37 and the nMOS transistor 41 are ON, the second switch element 44 is controlled to be OFF. Hence, it is possible to prevent a through current from passing through the pMOS transistor 37 and the nMOS transistor 41. The second switch element 44 does not affect the circuit operation at all when the output signal OUT2 switches to L level from H level because the second switch element 44 is controlled to be ON.

Figure 5:
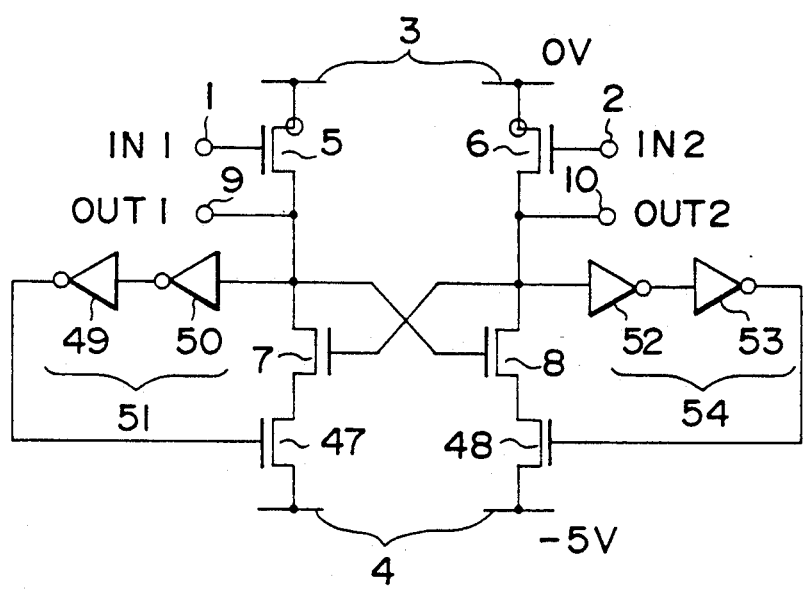
FIG. 5 is a circuit diagram of a first embodiment of the present invention.

A description will now be given of a first embodiment of the present invention with reference to FIG. 5, in which those parts which are the same as those shown in FIG. 1 are given the same reference numerals. As shown in FIG. 5, two nMOS transistors 47 and 48 and two delay circuits 51 and 54 are added to the circuit configuration shown in FIG. 1. The drain of the nMOS transistor 47 is connected to the source of the nMOS transistor 7, and the source of the nMOS transistor 47 is connected to the power supply line 4. The delay circuit 51 is composed of two inverters 49 and 50 connected in series. The gate of the nMOS transistor 47 is connected to an output terminal of the inverter 49. An input terminal of the inverter 50 is connected to the drain of the nMOS transistor 7. The drain of the nMOS transistor 48 is connected to the source of the nMOS transistor 8, and the source of the nMOS transistor 48 is connected to the power supply line 4. The delay circuit 54 is composed of two inverters 52 and 53 connected in series. The gate of the nMOS transistor 48 is connected to an output terminal of the inverter 53. An input terminal of the inverter 52 is connected to the drain of the nMOS transistor 8.

Figure 6:
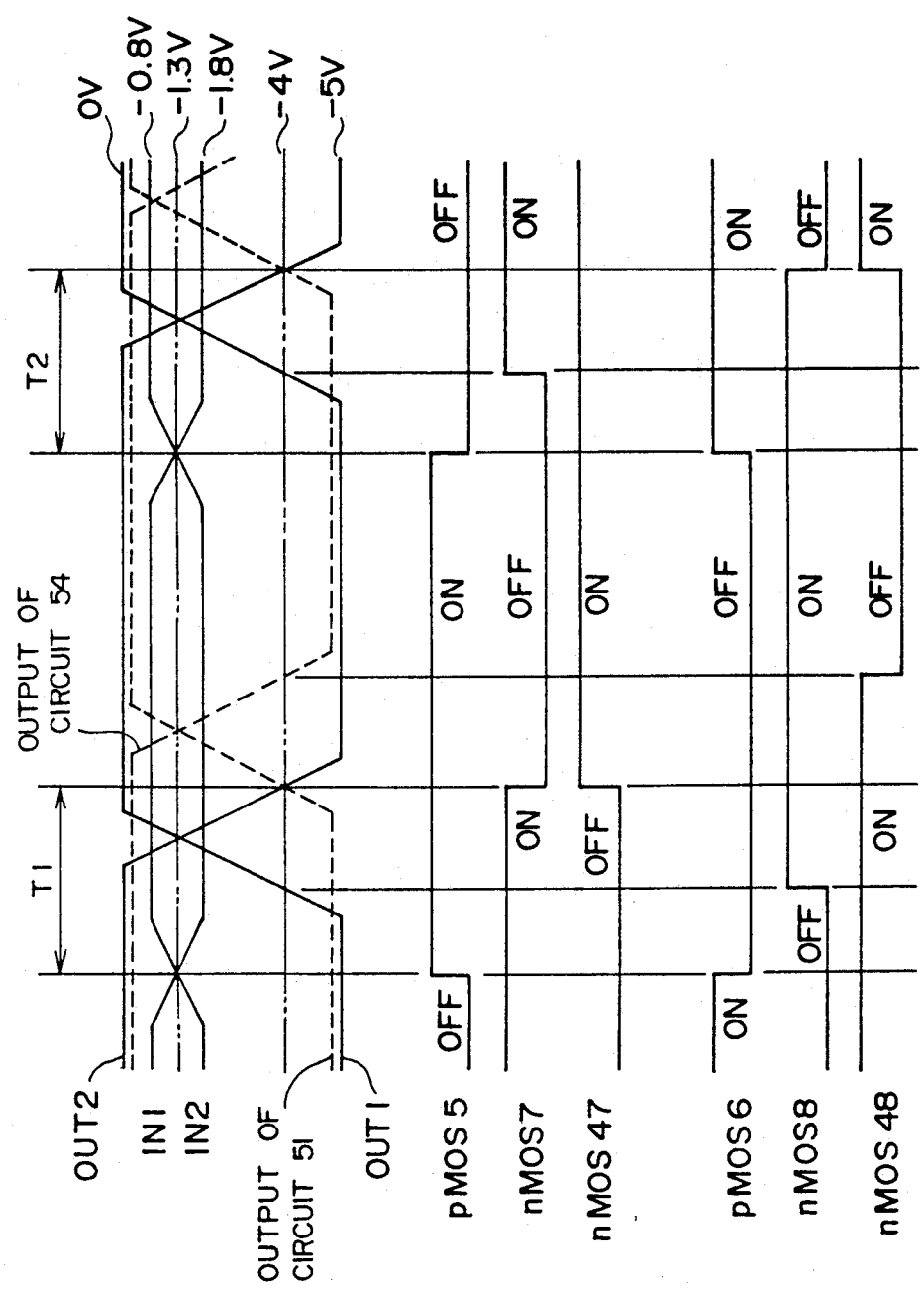
FIG. 6 is a waveform diagram showing the operation of the level conversion circuit shown in FIG. 5.

FIG. 6 is a waveform diagram showing the operation of the level conversion circuit shown in FIG. 5. As shown in FIG. 6, when the CMOS-level output signals OUT1 and OUT2 switch to H and L levels from L and H levels, respectively, both the pMOS transistor 5 and the nMOS transistor 7 are ON during the period T1. However, during the period T1, the nMOS transistor 47 is maintained in the OFF state. Hence, it becomes possible to prevent through current from passing through the pMOS transistor 5 and the nMOS transistor 7.

When the output signals OUT1 and OUT2 switch to L and H levels from H and L levels, respectively, both the pMOS transistor 6 and the nMOS transistor 8 are ON during the period T2. However, during the period T2, the nMOS transistor 48 is maintained in the OFF state. Hence, it becomes possible to prevent current from passing through the pMOS transistor 6 and the nMOS transistor 8.

In this manner, the level conversion circuit shown in FIG. 5 is capable of switching the output signals at a higher speed than that of the conventional level conversion circuit shown in FIG. 1 or that of the conventional circuit proposed in the aforementioned Japanese Application.

The delay circuit 51 consists of an even number of inverters (49 and 50) in order to turn ON the nMOS transistor 47 in synchronism with the switching of the output signal OUT2 from H level to L level. Similarly, the delay circuit 54 consists of an even number of inverters 52 and 53 in order to turn ON the nMOS transistor 48 in synchronism with the switching of the output signal OUT1 from H level to L level. The delay time of the delay circuit 51 is set to afford sufficient time to switch the output signals OUT1 and OUT2. More specifically, the delay time of the delay circuit 51 is adjusted so that the nMOS transistor 47 turns ON when the output signal OUT2 has decreased to become −4 V. The delay time of the delay circuit 54 is adjusted so that the nMOS transistor 48 turns ON when the output signal OUT1 has decreased to −4.0 V.

Figure 7:
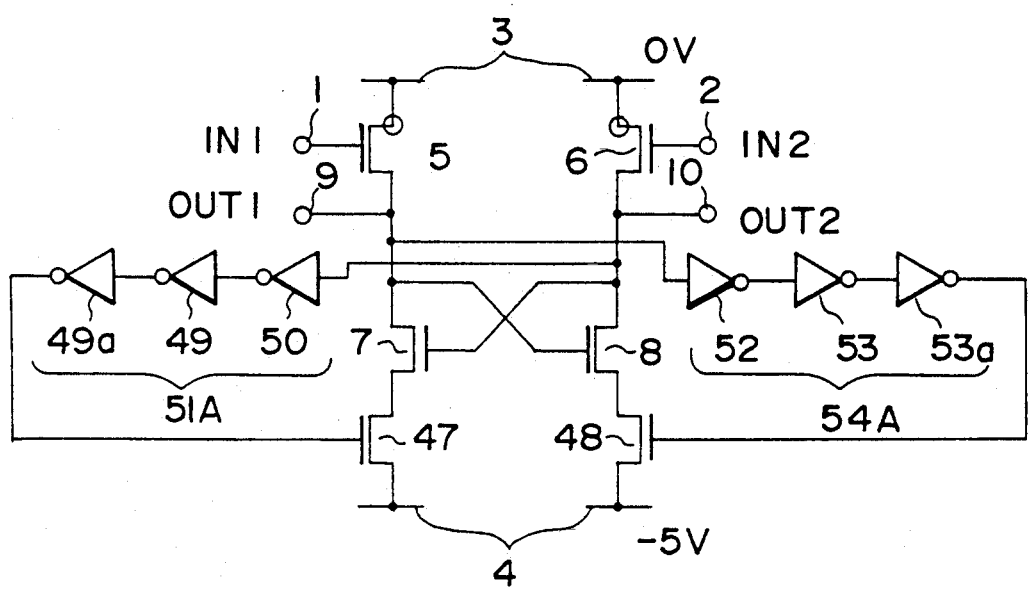
FIG. 7 is a circuit diagram of a variation of the level conversion circuit shown in FIG. 5.

FIG. 7 is a circuit diagram of a variation of the first embodiment of the present invention shown in FIG. 5. In FIG. 7, parts which are the same as those shown in FIG. 5 are given the same reference numerals. A delay circuit 51A is substituted for the delay circuit 51 shown in FIG. 5, and a delay circuit 54A is substituted for the delay circuit 54. The nMOS transistor 47 is driven by the output signal OUT2 via the delay circuit 51A, and the nMOS transistor 48 is driven by the output signal OUT1 via the delay circuit 54A. The delay circuit 51A consists of an odd number of inverters (49a, 49 and 50) in order to turn ON the nMOS transistor 47 in synchronism with the switching of the output signal OUT2 from H level to L level. Similarly, the delay circuit 54A consists of an odd number of inverters (52, 53 and 53a) in order to turn ON the nMOS transistor 48 in synchronism with the switching of the output signal OUT1 from H level to L level.

Figure 8:
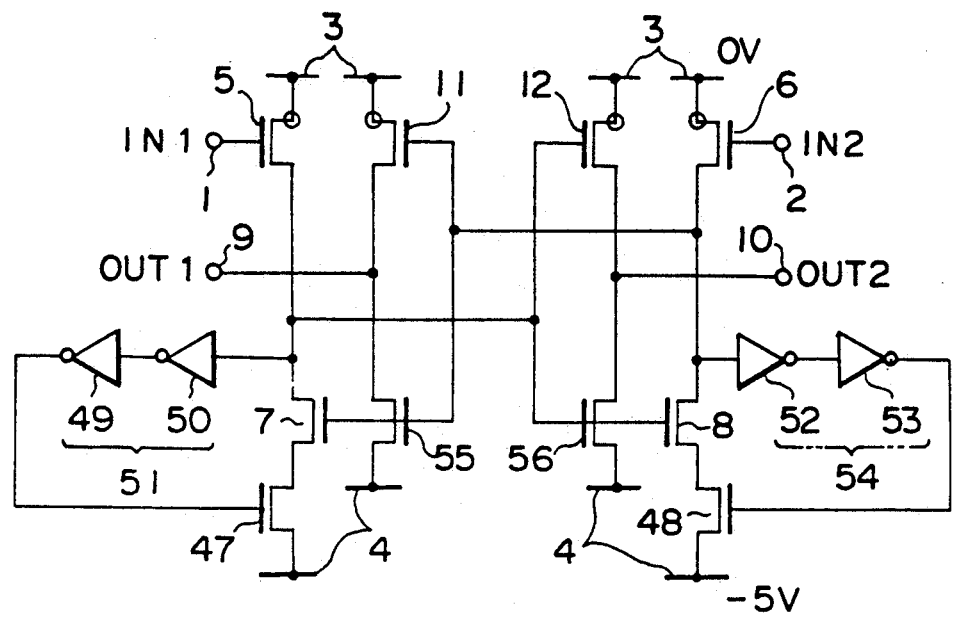
FIG. 8 is a circuit diagram of a second embodiment of the present invention.

A description will now be given of a second embodiment of the present invention with reference to FIG. 8, in which those parts which are the same as those shown in the previous figures are given the same reference numerals. As shown in FIG. 8, two pMOS transistors 11 and 12 and two nMOS transistors 55 and 56 are added to the circuit configuration shown in FIG. 5. The size of each of the nMOS transistors 55 and 56 can be smaller than that of each of the nMOS transistors 47 and 48. The sources of the pMOS transistors 11 and 12 are connected to the power supply line 3, and the drains thereof are connected to the drains of the nMOS transistors 55 and 56, respectively. The gate of the pMOS transistor 11 is connected to the drain of the nMOS transistor 8 and the gates of the nMOS transistors 7 and 55. The gate of the pMOS transistor 12 is connected to the drain of the nMOS transistor 7 and the gates of the nMOS transistors 8 and 56. The sources of the nMOS transistors 55 and 56 are connected to the power supply line 4. The output terminal 9 is connected to the drains of the pMOS and nMOS transistors 11 and 55, and the output terminal 10 is connected to the drains of the pMOS and nMOS transistors 12 and 56.

The pMOS transistor 11 and the nMOS transistor 7 form a latch circuit, and the pMOS transistor 12 and the nMOS transistor 8 form a latch circuit. These latch circuits function to maintain the states of the output signals OUT1 and OUT2 when both of the input signals IN1 and IN2 happen to become equal to −0.8 V (H level). In this case, both of the pMOS transistors 5 and 6 are turned OFF. During the normal operation, the nMOS transistors 47 and 48 shown in FIG. 8 turn ON/OFF in the same manner as those shown in FIG. 5. The level conversion circuit shown in FIG. 8 operates at a higher speed that the conventional circuit shown in FIG. 5.

A current passes through the pMOS transistor 11 and the nMOS transistor 55, and a current passes through the pMOS transistor 12 and the nMOS transistor 56. However, it is possible to substantially prevent these currents from delaying the switching operation by forming the pMOS transistors 11 and 12 and the nMOS transistors 55 and 56 with small-size transistors.

Figure 9:
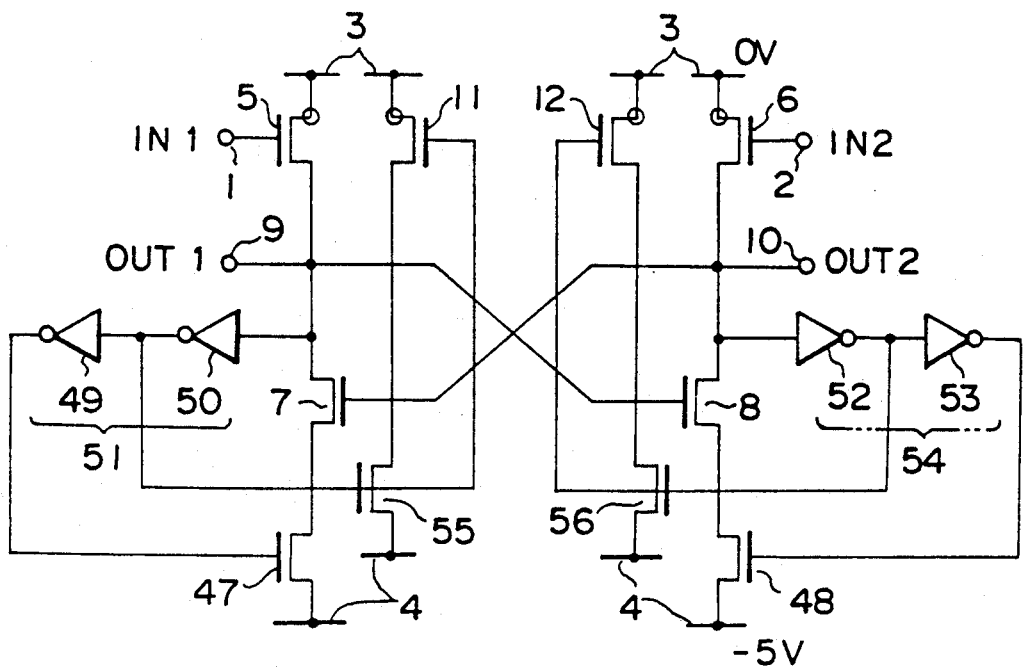
FIG. 9 is a circuit diagram of a third embodiment of the present invention.

FIG. 9 is a circuit diagram of a third embodiment of the present invention. In FIG. 9, those parts which are the same as those shown in FIG. 8 are given the same numerals. The output terminal 9 is connected to the drain of the nMOS transistor 7 and the gate of the nMOS transistor 8. The output terminal 10 is connected to the drain of the nMOS transistor 8 and the gate of the nMOS transistor 7. The gates of the pMOS transistor 11 and nMOS transistor 55 are connected to the output terminals of the inverter 50 of the delay circuit 51. The gates of the pMOS transistor 12 and nMOS transistor 56 are connected to the output terminal of the inverter 52 of the delay circuit 54. The level conversion circuit shown in FIG. 9 has the same advantages as those of the level conversion circuit shown in FIG. 8.

Figure 10:
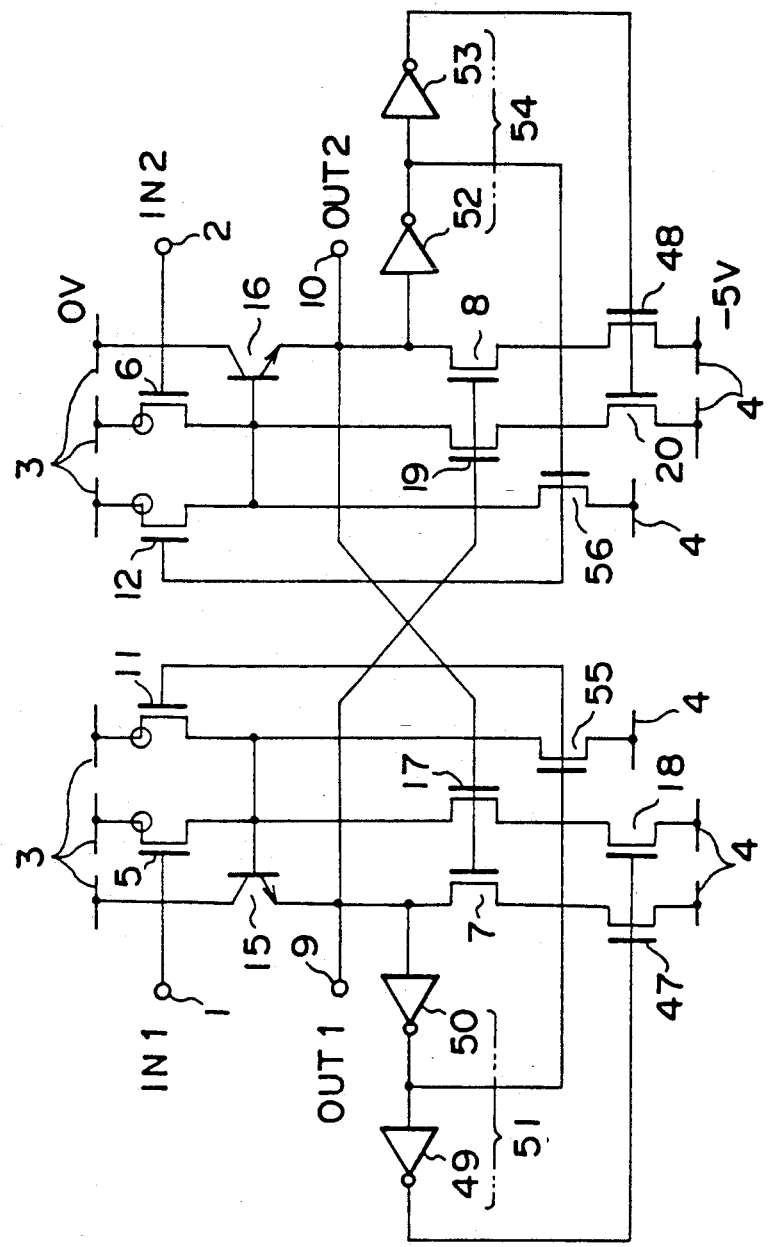
FIG. 10 is a circuit diagram of a fourth embodiment of the present invention.

FIG. 10 is a circuit diagram of a fourth embodiment of the present invention. In FIG. 10, those parts which are the same as those shown in FIG. 9 are given the same reference numerals. Two NPN bipolar transistors 15 and 16 and four nMOS transistors 17-20 are added to the level conversion circuit shown in FIG. 9. The collectors of the NPN transistors 15 and 16 are connected to the power supply line 3, and the emitters thereof are connected to the output terminals 9 and 10, respectively. The base of the NPN transistor 15 is connected to the drains of the pMOS transistors 5 and 11, and the base of the NPN transistor 16 is connected to the drains of the pMOS transistors 6 and 12. A series circuit consisting of the nMOS transistors 17 and 18 is connected between the drain of the pMOS transistor 5 and the power supply line 4, and a series circuit consisting of the nMOS transistors 19 and 20 is connected between the drain of the pMOS transistor 6 and the power supply line 4.

The NPN transistor 15 supplies a load connected to the output terminal 9 with a large amount of current when the output signal OUT1 switches to H level (0 V) from L level (−5 V). With this operation, it becomes possible to switch the output signal OUT1 from H level to L level at a speed higher than those of the first through third embodiments of the present invention. The NPN transistor 16 supplies a load connected to the output terminal 10 with a large amount of current when the output signal OUT2 switches to H level (0 V) from L level (−5 V). With this operation, it becomes possible to switch the output signal OUT2 from H level to L level at a speed higher than those of the first through third embodiments of the present invention.

The nMOS transistor 17 functions to discharge the base of the NPN transistor 15 when the NPN transistor 15 turns OFF, that is, when the output signal OUT1 switches to L level from H level. With this operation, it becomes possible to increase the speed of the switching to L level from H level. The nMOS transistor 19 functions to discharge the base of the NPN transistor 16 when the NPN transistor 16 turns OFF, that is, when the output signal OUT2 switches to L level from H level. With this operation, it becomes possible to increase the speed of the switching from H level to L level.

The nMOS transistors 47 and 48 operate in the same manner as described previously and the nMOS transistors 18 and 20 operate in synchronism with the nMOS transistors 47 and 48, respectively. Thus, it is possible to prevent currents from passing through the pMOS and nMOS transistors 5 and 7, pMOS and nMOS transistors 5 and 17, pMOS and nMOS transistors 6 and 8, and pMOS and nMOS transistors 6 and 19.

Figure 11:
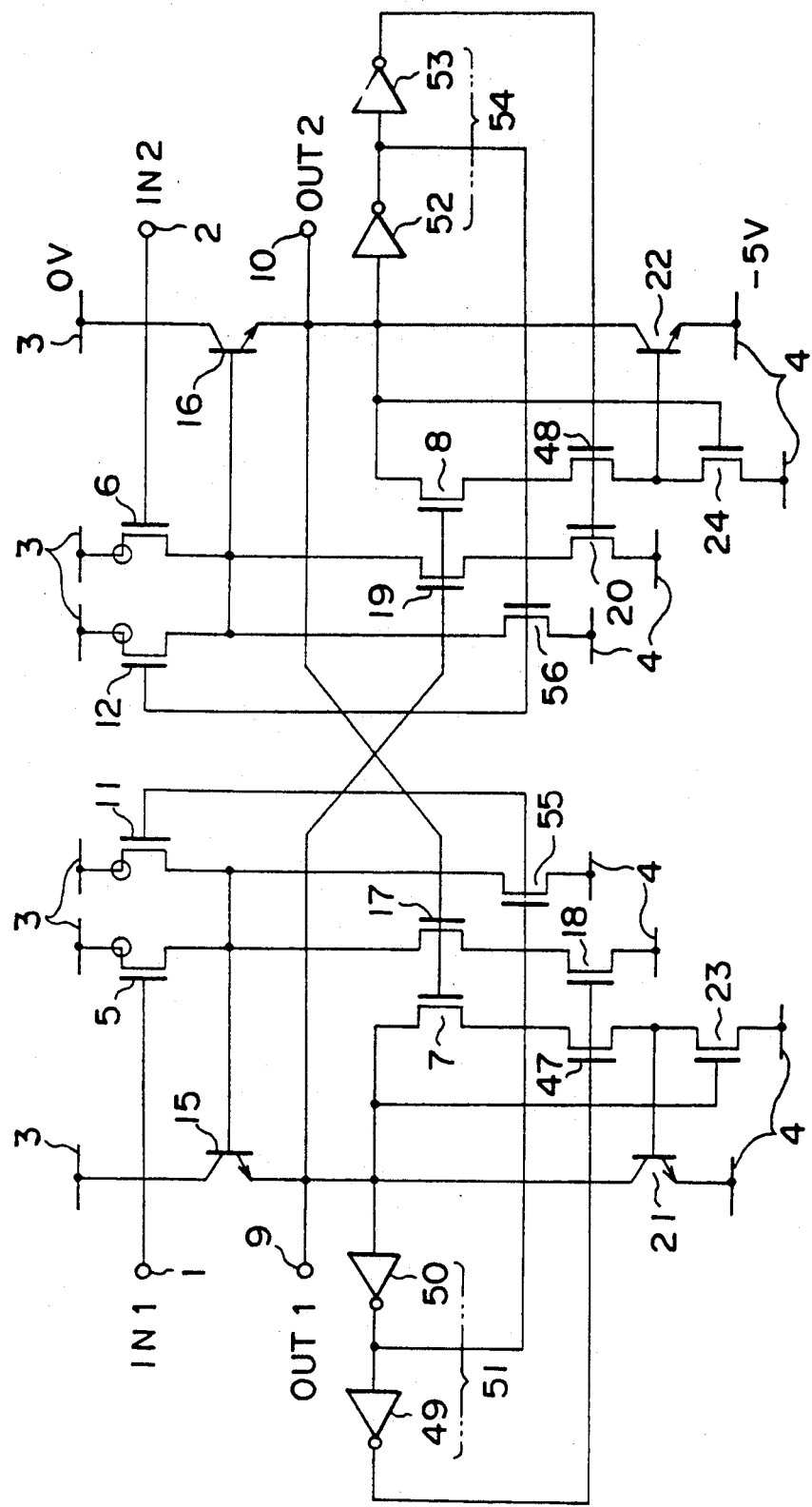
FIG. 11 is a circuit diagram of a fifth embodiment of the present invention.

FIG. 11 is a circuit diagram of a fifth embodiment of the present invention. In FIG. 11, those parts which are the same as those shown in FIG. 10 are given the same reference numerals. As shown in FIG. 11, two NPN bipolar transistors 21 and 22 and two nMOS transistors 23 and 24 are added to the circuit configuration shown in FIG. 10. The collector of the NPN transistor 21 is connected to the emitter of the NPN transistor 15, and the emitter of the NPN transistor 21 is connected to the power supply line 4. The base of the NPN transistor 21 is connected to the source of the nMOS transistor 47. The drain of the nMOS transistor 23 is connected to the source of the nMOS transistor 47, and the source of the nMOS transistor 23 is connected to the power supply line 4. The gate of the nMOS transistor 23 is connected to the output terminal OUT1.

The collector of the NPN transistor 22 is connected to the emitter of the NPN transistor 16, and the emitter of the NPN transistor 22 is connected to the power supply line 4. The base of the NPN transistor 22 is connected to the source of the nMOS transistor 48. The drain of the nMOS transistor 24 is connected to the source of the nMOS transistor 48, and the source of the nMOS transistor 24 is connected to the power supply line 4. The gate of the nMOS transistor 24 is connected to the output terminal 10.

The NPN transistor 21 functions to discharge the load connected to the output terminal 9 when the output signal OUT1 switches to L level (−5 V) from H level (0 V). With this operation, it becomes possible to increase the speed of the switching from H level to L level. The NPN transistor 22 functions to discharge the load connected to the output terminal 10 when the output signal OUT2 switches to L level from H level. With this operation, it becomes possible to increase the speed of the switching from H level to L level.

The nMOS transistors 47 and 48 operate in the same manner as described previously, and the nMOS transistors 18 and 20 operate in synchronism with the nMOS transistors 47 and 48, respectively. Thus, it is possible to prevent currents from passing through the pMOS and nMOS transistors 5 and 7, pMOS and nMOS transistors 5 and 17, pMOS and nMOS transistors 6 and 8, and pMOS and nMOS transistors 6 and 19.

Figure 12:
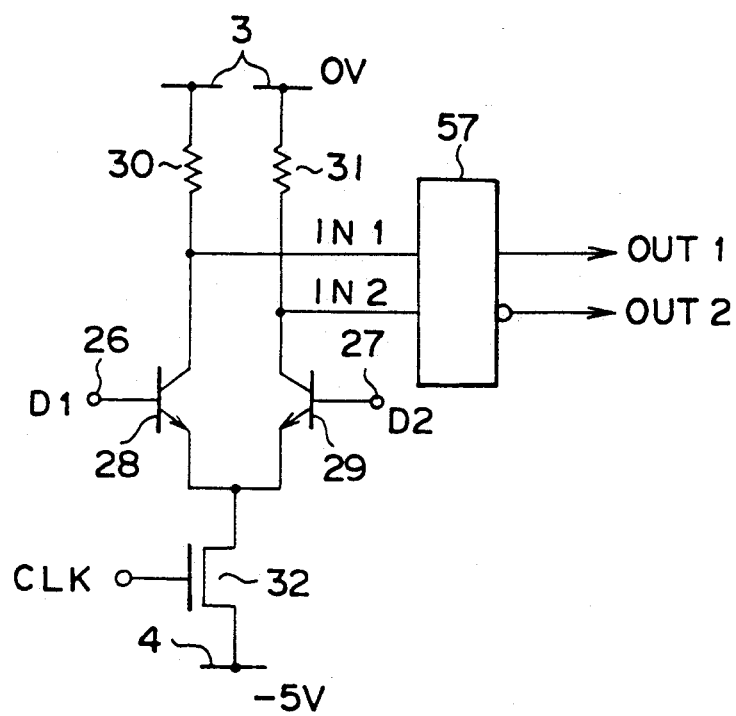
FIG. 12 is a circuit diagram of an ECL circuit connected to the level conversion circuit of the present invention.

FIG. 12 shows an ECL circuit connected to the level conversion circuit according to the present invention. A block 57 is a level conversion circuit according to one of the aforementioned second through fifth embodiments of the present invention. The ECL circuit is composed of two NPN transistors 28 and 29, an nMOS transistor 32, and two resistors 30 and 31. The collectors of the NPN transistors 28 and 29 are coupled to the power supply line 3 via the resistors 30 and 31, and the emitters thereof are coupled to the power supply line 4 via the nMOS transistor 32. A clock signal CLK is applied to the gate of the nMOS transistor 32, and data signals D1 and D2 are input to the NPN transistors 28 and 29 via input terminals 26 and 27 in synchronism with the clock signal CLK. When the clock signal switches to L level from H level, the nMOS transistor 32 turns OFF, and both the input signals IN1 and IN2 switch to H level. Thus, the output signals OUT1 and OUT2 are maintained at the previous states.

Figure 13:
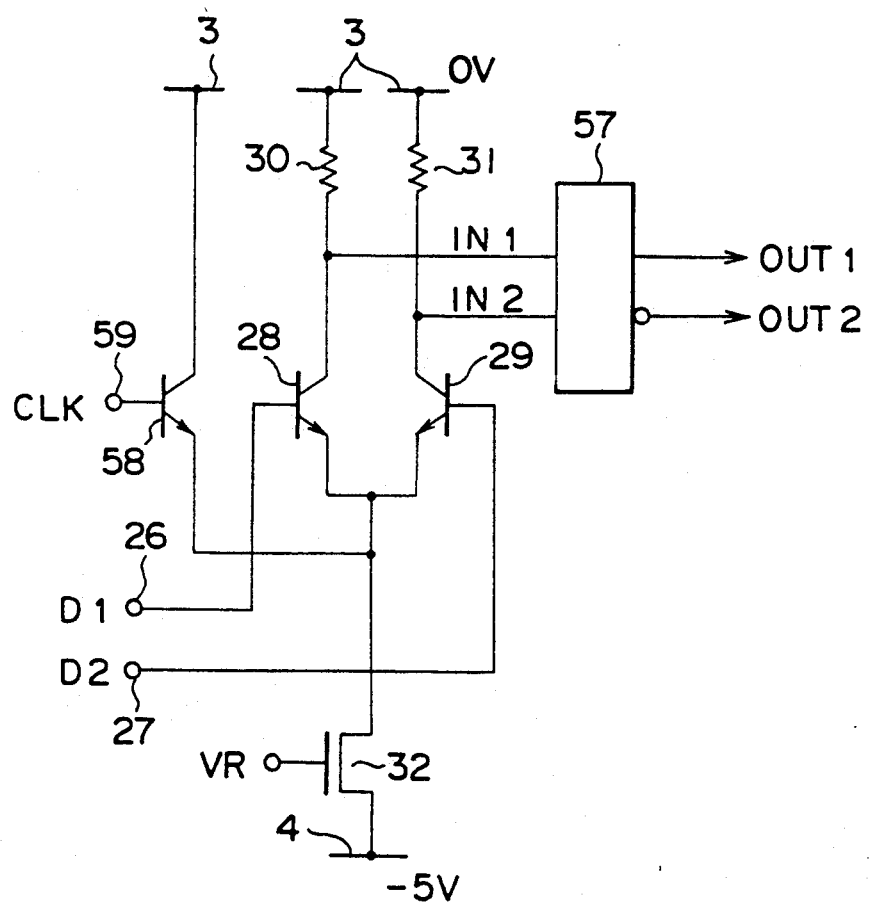
FIG. 13 is a circuit diagram of a variation of the ECL circuit shown in FIG. 12.

FIG. 13 is a circuit diagram of a variation of the ECL circuit shown in FIG. 12. In FIG. 13, those parts which are the same as those shown in FIG. 12 are given the same reference numerals. An NPN transistor 58 is added to the ECL circuit shown in FIG. 12. The base of the NPN transistor 58 receives the clock signal CLK via a terminal 59. The collector of the NPN transistor 59 is connected to the power supply line 3, and the emitter thereof is connected to the emitters of the NPN transistors 28 and 29. The clock signal CLK has a high level higher than that of each of the input signals D1 and D2. A reference voltage VR is applied to the gate of the nMOS transistor 32. When both the input signals IN1 and IN2 switch to H level, the output signals OUT1 and OUT2 are maintained in the previous states.

FIG. 14 a block diagram of an SRAM to which the present invention is applied. The SRAM shown in FIG. 14 is composed of a memory cell array 101 including a plurality of memory cells MC arranged in rows and columns, a group of X address buffers 102, an X decoder 103, a word driver 104, a group of Y address buffers 105, a Y decoder 106, a sense amplifier/write driver 107, a group of input buffers 108, a read/write controller 109, and an output buffer 110. The present invention is applied to, for example, the sense amplifier/write driver 107.

The X decoder 102 receives X address bits X0–Xn−1 via the buffers 102, and the word driver 104 drives word lines coupled to the memory cells in the memory cell array 101 on the basis of decoded X address bits output by the X decoder 103. The Y decoder 106 receives Y address bits Y0–Yn−1 via the buffers 105, and the write driver 107 controls sense amplifiers, such as SA1–SA4, on the basis of decoded Y address bits. A chip select signal CS, a write enable signal WE and write data Din are applied to the read/write controller 109 via the buffers 108. The read/write controller 109 controls the sense amplifier/write driver 107 so that write data Din are written into memory cells specified by the Y decoder 106. Read data from the memory cell array 101 are applied to the output buffer 110.

Figure 15A:
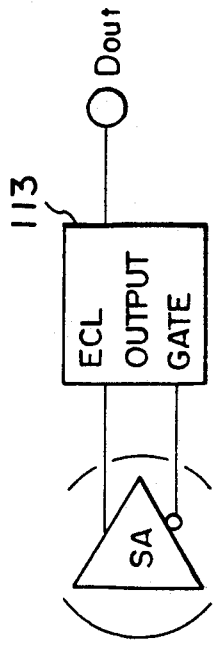
FIGS. 15A and 15B are block diagrams of input and output buffer circuits, respectively.
Figure 15B:
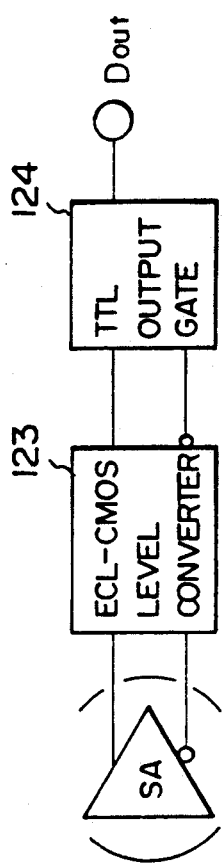

The present invention can be applied to, for example, buffers 108 and 110. FIG. 15A shows an ECL input buffer, which is composed of an ECL input gate circuit 111 and an ECL-CMOS level converter 112. The ECL input gate circuit 111 includes a circuit as shown in FIG. 12 or FIG. 13. The ECL-CMOS level converter 112 is configured according to the present invention. An input data signal is applied to the gate circuit 111, which outputs complementary signals to the level converter 112. Complementary CMOS-level signals IN and IN are output by the level converter 112. FIG. 15B shows an ECL output buffer, which includes an ECL output gate circuit 113 connected to a sense amplifier SA provided in the sense amplifier/write driver 107. The ECL output gate circuit 113 converts read data from the sense amplifier SA into an ECL-level output signal Dout.

Figure 16A:
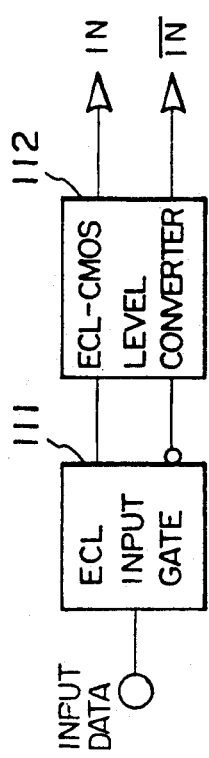
FIGS. 16A and 16B are block diagrams of input and output buffer circuits.
Figure 16B:
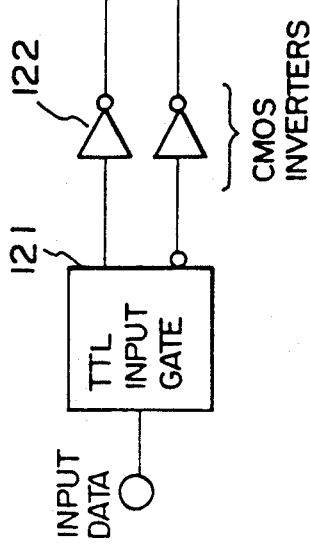

FIG. 16A shows a TTL input buffer, which is composed of a TTL input gate 121 and CMOS inverters 122. Complementary input signals output by the TTL input gate 121 pass through the CMOS inverters 122, and are output as input signals IN and IN. FIG. 16B shows a TTL output buffer, which is composed of an ECL-CMOS level converter 123 and a TTL output gate 124. Read data from the sense amplifier SA is converted into complementary CMOS-level signals, which are converted into a TTL-level output signal Dout.

The present invention is not limited to the specifically disclosed embodiments, and variations and modifications may be made without departing from the scope of the present invention.

What is claimed is:

1. A level conversion circuit having first and second output terminals, comprising:

a first p-channel MOS (pMOS) transistor having a source connected to a first power supply line, a gate receiving a first input signal, and a drain;

a second pMOS transistor having a source connected to the first power supply line, a gate receiving a second input signal, and a drain;

a first n-channel MOS (nMOS) transistor having a drain connected to the fist output terminal and the drain of the first pMOS transistor, a gate, and a source, a first output signal being output thereby at the first output terminal;

a second nMOS transistor having a drain connected to the second output terminal, the drain of the second pMOS transistor and the gate of the first nMOS transistor, a gate connected to the drain of the first nMOS transistor, and a source, a second output signal being output thereby at the second output terminal; and switch means, connecting the first and second p-MOS transistor to a second power supply line, for preventing a current from passing through the first pMOS transistor and the first nMOS transistor to the second power supply line when both the first pMOS transistor and the first nMOS transistor are ON and for preventing a current from passing through the second pMOS transistor and the second nMOS transistor to the second power supply line when both the second pMOS transistor and the second nMOS transistor to the second power supply line when both the second pMOS transistor and the second nMOS transistor are ON, said switch means further comprising:

a third nMOS transistor having a drain connected to the source of the first nMOS transistor, a source connected to the second power supply line, and a gate;

first delay means, connected between the drain of the first nMOS transistor and the gate of the third nMOS transistor, for receiving and delaying the received first output signal and for applying the thus delayed first output signal to the gate of the third nMOS transistor;

a fourth nMOS transistor having a drain connected to the source of the second nMOS transistor, a source connected to the second power supply line, and a gate; and second delay means, connected between the drain of the second nMOS transistor and the gate of the fourth nMOS transistor, for receiving and delaying the second output signal and for applying the thus delayed second output signal to the gate of the fourth nMOS transistor.

2. A level conversion circuit ax claimed in claim 1, wherein:

said first delay means comprises an even number of inverters connected in series; and said second delay means comprises an even number of inverters connected in series.

3. A level conversion circuit as claimed in claim 1, wherein:

said first delay means comprises and odd number of inverters connected in series; and said second delay means comprises an odd number of inverters connected in series.

4. A level conversion circuit as claimed in claim 1, wherein said level conversion circuit further comprises latch means for preventing the first and second output signals from changing when both the first and second input signals switch to a predetermined level.

5. A level conversion circuit as claimed in claim 4, wherein said predetermined level is approximately equal to the potential of the first power supply line.

6. A level conversion circuit as claimed in claim 1, wherein said level conversion circuit further comprises:

a third pMOS transistor having a source connected to the first power supply line, a drain connected to the first output terminal, and a gate connected to the drain of the second nMOS transistor;

a fifth nMOS transistor having a drain connected to the drain of the third pMOS transistor, a source connected to the second power supply line, and a gate connected to the gate of the third pMOS transistor and the gate of the first nMOS transistor;

a fourth pMOS transistor having a source connected to the first power supply line, a drain connected to the second output terminal, and a gate connected to the drain of the first nMOS transistor; and a sixth nMOS transistor having a drain connected to the drain of the fourth pMOS transistor, a source connected to the second power supply line, and a gate connected to the gate of the fourth pMOS transistor and the gate of the second nMOS transistor.

7. A level conversion circuit as claimed in claim 1, wherein said level conversion circuit further comprises:

a third pMOS transistor having a source connected to the first power supply line, a gate connected to the first delay means and receiving an inverted version of the delayed first output signal, and a drain;

a fifth nMOS transistor having a drain connected to the drain of the third pMOS transistor, a source connected to the second power supply line, and a gate connected to the gate of the third pMOS transistor;

a fourth pMOS transistor having a source connected to the first power supply line, a gate connected to the second delay means and receiving an inverted version of the delayed second output signal, and a drain; and a sixth nMOS transistor having a drain connected to the drain of the fourth pMOS transistor, a source connected to the second power supply line, and a gate connected to the gate of the fourth pMOS transistor.

8. A level conversion circuit as claimed in claim 7, wherein:
the first delay circuit comprises an even number of inverters connected in series at a first intermediate node;
the second delay circuit comprises an even number of inverters connected in series at a second intermediate node;
the inverted version of the delayed first output signal is obtained at the first intermediate node; and
the inverted version of the delayed second output signal is obtained at the second intermediate node.

9. A level conversion circuit as claimed in claim 1, wherein said level conversion circuit comprises:
first charging means for charging a load coupled to the first output terminal when the first output signal switches to a high level, approximately equal to the potential of the first power supply line, from a low level, approximately equal to the potential of the second power supply line; and
second charging means for charging a load coupled to the second output terminal when the second output signal switches to the high level from the low level.

10. A level conversion circuit as claimed in claim 1, wherein said level conversion circuit further comprises:
first discharging means, defining a corresponding first discharging path coupled to the first output terminal, for discharging a load coupled to the first output terminal when the first output terminal switches to a low level, approximately equal to the potential of the second power supply line, from a high level, approximately equal to the potential of the first power supply line; and
second discharging means, defining a corresponding second discharging path coupled to the second output terminal, for discharging a load coupled to the second output terminal when the second output terminal switches to the low level from the high level.

11. A level conversion circuit as claimed in claim 1, wherein said level conversion circuit further comprises:
first charging means for charging a load coupled to the first output terminal when the first output signal switches to a high level, approximately equal to the potential of the first power supply line, from a low level, approximately equal to a potential of the second power supply line;
second charging means for charging a load coupled to the second output terminal when the second output signal switches to the high level from the low level;
first discharging means, defining a corresponding first discharging path coupled to the first output terminal, for discharging the load coupled to the first output terminal when the first output terminal switches to the low level from the high level; and
second discharging means, defining a corresponding second discharging path coupled to the second output terminal, for discharging the load coupled to the second output terminal when the second output terminal switches to the low level from the high level.

12. A level conversion circuit as claimed in claim 11, wherein:
the first charging means comprises a Bi-CMOS circuit which comprises a bipolar transistor circuit and a CMOS inverter circuit;
the second charging means comprises a Bi-CMOS circuit which comprises a bipolar transistor circuit and a CMOS inverter circuit;
the first discharging means comprises a Bi-CMOS circuit which comprises a bipolar transistor circuit and a CMOS inverter circuit; and
the second discharging means comprises a Bi-CMOS circuit which comprises a bipolar transistor circuit and a CMOS inverter circuit.

13. A level conversion circuit as claimed in claim 11, wherein said level conversion circuit comprises latch means for preventing the first and second output signals from changing when both the first and second input signals switch to a predetermined level.

14. A level conversion circuit as claimed in claim 1, wherein said switch means comprises:
a first switch connected between the first nMOS transistor and the second power supply line;
a second switch connected between the second nMOS transistor and the second power supply line;
first switch control means for controlling said first switch on the basis of one of the first and second output signals; and
second switch control means for controlling said second switch on the basis of the other one of the first and second output signals.

15. A level conversion circuit as claimed in claim 1, wherein:
each of the first and second input signals is an ECL-level signal; and
each of the first and second output signals is a CMOS-level signal.

16. A level conversion circuit as claimed in claim 1, wherein said switch means is coupled between the sources of the first and second NMOS transistors and the second power supply line.

17. A level conversion circuit comprising:
a level converter having first and second input terminals receiving first and second input signals and first and second output terminals via which first and second output signals having respective amplified levels are output, said level converter being coupled between first and second power supply systems; and
switch means, responsive to the first and second output signals, for preventing through currents from passing from the first power supply system to the second power supply system through the level converter, said switch means comprising:
switches inserted into paths through which said through current pass,
delay means for receiving and delaying said first and second output signals and for generating first and second delayed output signals, and
control means for controlling said switches in response to said first and second delayed signals.

* * * * *

UNITED STATES PATENT AND TRADEMARK OFFICE
CERTIFICATE OF CORRECTION

PATENT NO. : 5,241,225
DATED : Aug. 31, 1993
INVENTOR(S) : OKAJIMA et al.

It is certified that error appears in the above-indentified patent and that said Letters Patent is hereby corrected as shown below:

TITLE PAGE: [54], in line 4 of the title, change "CONVERTER" to --CONVERTED--.

Col. 1, line 5, change "CONVERTER" to --CONVERTED--.

* Col. 8, line 33, after "FIG. 14" insert --is--.

Col. 9, line 32, change "fist" to --first--;
* lines 53-55, delete "to the second power supply line when both the second pMOS transistor and the seoncd nMOS transistor".

Signed and Sealed this

Nineteenth Day of July, 1994

Attest:

BRUCE LEHMAN

Attesting Officer

Commissioner of Patents and Trademarks